United States Patent [19]

Chevalier

[11] Patent Number: 4,593,326
[45] Date of Patent: Jun. 3, 1986

[54] ELECTROMECHANICAL PREPARATION OF PHOTOENGRAVING CYLINDERS

[76] Inventor: Jean Chevalier, 93 Avenue des Champs Elysees, Paris 75008, France

[21] Appl. No.: 654,386

[22] Filed: Sep. 25, 1984

[30] Foreign Application Priority Data

Sep. 26, 1983 [FR] France ................... 83 15214

[51] Int. Cl.$^4$ .............. H04N 1/21; H04N 1/23; G03B 27/62
[52] U.S. Cl. .................. 358/299; 358/297; 355/75
[58] Field of Search ........... 358/297, 299, 302, 285; 355/3 R, 75

[56] References Cited

U.S. PATENT DOCUMENTS 2,684,043 12/1953 Dalton ..................... 358/297 X
4,108,659 8/1978 Dini ........................ 358/299 X
4,125,842 11/1978 Ohnishi et al. ............ 358/297 X

OTHER PUBLICATIONS

"Opaque Photographic Products for Electromechanical Engraving: Continuous Tone and Halftone", *GRI Gravure Research Institute*, Report No. M-243, Nov. 9–12, 1983.

*Primary Examiner*—E. A. Goldberg
*Assistant Examiner*—Patrick W. Foster
*Attorney, Agent, or Firm*—Wegner & Bretschneider

[57] ABSTRACT

Halftone transparencies can be used in electromechanical etchers for gravure platemaking if a reflective layer is in optical secure contact with one side of the half-tone transparency. The halftone transparency may then be used on the scanning drum of the electro-mechanical etcher.

9 Claims, No Drawings

ELECTROMECHANICAL PREPARATION OF PHOTOENGRAVING CYLINDERS

BACKGROUND OF THE INVENTION

1. Field of the Invention

The present invention relates to electromechanical etching, where an image is read by reflection of radiation and resulting electronic signals are used to engrave an image on a metal plate or drum.

2. Background Art

One method for producing gravure printing plates consists of an electromechanical process in which there are a series of steps before the plate is made. An original image is converted to a positive or negative on a highly reflective sheet, called opalescent film. The imaged opalescent film is then placed on a scanning drum (usually having a highly reflective white surface) and point-by-point or area-by-area reflective optical densities are read by a densitometer. This information is immediately transmitted or stored in electronic form. The information is eventually transmitted to a mechanical engraver. The electronic signals or impulses tell the engraving apparatus what to do. One commercially available form of this apparatus, the Helio-Klischograph, uses a diamond pointed stylus that vibrates at between 3000 and 5000 times per second. It is therefore capable of cutting up to 5,000 tiny inkwells on the surface of a metal plate or cylinder each second. The inkwells or pits vary in size and depth according to the specific electronic signals originating from the electronic eye within the scanner. The final gravure plate is formed by this etching of the surface of the plate to produce an image corresponding to the read image of the substrate. With this particular type of equipment, the pit is a characteristic pyramidal shape when viewed under a microscope, as compared to the saucer or oval shaped pits produced by chemcial etching.

The need to make the intermediate introduces the risk of additional errors. The required exposure to a light source and chemical treatment (development) of the photosensitive material introduce variable that can affect the quality of the intermediate. The direct use of the transparent screened film would eliminate those variables and be more convenient.

It has been reported by the Gravure Research Institute (Report No. M-243 "Opaque Photographic Products for Electromechanical Engraving: Continuous Tone and Halftone", Nov. 9-12, 1983, 36th Annual Meeting) that most printers experienced considerable difficulty when attempting to use transparency halftone film as the film to be scanned while engraving the metal plate. The use of a halftone original would enable the process to be performed without having to produce the highly reflective image from the original. The source of these problems were reported to be related to varying reflective indices due to (1) different types of film being scanned simultaneously, (2) different chemistries being used, and (3) a lack of transparency of some of the films used. In particular, multiple reflections off protective topcoats, antihalation layers and subbing layers was indicated as generating spurious reflective images which accompanied the reflected scanning image of the halftone image.

SUMMARY OF THE INVENTION

Electromechanical etching of gravure plates can be made by scanning halftone transparencies (positives or negatives) or offset screened originals (positives or negatives) directly, without first making a highly reflective intermediate. The lamination or backside coating of a highly reflective layer is effected on the back of the halftone transparency. The laminated or backside coated original can then be placed directly on the scanning drum. The use of an optically bonded or adhered reflective layer prevents undesirable, non-image related reflections.

DETAILED DESCRIPTION OF THE INVENTION

Halftone transparency images can be used in the electromechanical etching of gravure plates. The lamination or coating of an opaque reflective layer onto the backside of the film enables the film to be directly read from when placed on the scanning drum of an electromechanical etcher. When the layer is in optical adherence to the backside of the transparency, distortion, refraction and other light-scattering phenomena are avoided.

Although the problems with light scattering during scanning have been previously reported to be related to the layers of the film itself, backside treatment has been found to correct the problem. It is now believed, according to the findings of the present invention, that previously encountered problems resulted from poor optical conformance of the backside of the transparency with the white reflective surface of the scanning drum. Air gaps between the transparency and the scanning drum produced Newton rings which were sensed by the electronic eye. The spurious reflected light produced by the Newton rings therefore created the spurious electronic signal.

The present invention is practiced by providing a halftone transparency, providing the transparency with a back layer of a reflective material, placing the transparency with a backside reflective layer on the scanning drum of an electromechanical gravure etcher, scanning the transparency with radiation, generating electronic signals from radiation reflected during scanning, and using the electronic signals to direct a mechanical etcher to etch a metal gravure plate. The signals may be passed directly to the etcher and/or may be stored for later use.

The reflective layer may be applied to the back of the transparency by a number of means. A preformed film of reflective material may be formed. Over the surface to be laminated to the transparency is then coated a pressure sensitive adhesive, thermally laminable adhesive or a solvent sensitive (e.g., water or alcohol activatable) adhesive. Pressure sensitive adhesives such as polyurethanes or polyacrylates may be used, for example. Thermally activatable adhesives such as hot-melt polyamides or polyvinyl resins are examples of heat sensitive adhesives. Examples of solvent activatable adhesives are polyvinyl alcohol and polyvinyl pyrrollidine.

The reflective layer may also be coated directly onto the back of the transparency. Reflective pigments may, for example, be mixed with a binder resin and coated onto the backside of the transparency. More complex procedures such as the vapor deposition of a reflective material (e.g., metal) onto the backside could also be useful.

The preferred procedure according to the present invention is to laminate a preformed film onto the back of the transparency. The use of a pressure sensitive adhesive on the reflective layer is the most preferred embodiment.

The reflective layer itself may be any reflective layer including those that scatter light diffusely. The most convenient reflective layer is a binder containing large quantities of reflective pigment. Polymeric resins with high concentrations of white pigment such as titanium dioxide or zinc oxide are preferred according to the present invention. White pigmented backgrounds of any material that match or approximate the white reflective surface of the scanning drum are useful, either as coating or as laminable films. By "reflective" it is meant that the layer does not absorb more than 40% of incident visible radiation. Preferably less than 20% of incident visible radiation is absorbed. The reflective layer should be smooth and free of grain to insure optimum results. The layer can be adhered to either side of the transparency, in contact with the emulsion or the support for the emulsion. Conventional laminating equipment using nip rollers is preferred in laminating the reflective layer to the film. The nip rollers assist in removing air bubbles from between the layers.

Typical constructions of laminable reflective sheets would comprise a support layer (e.g., of from 0.3 to 5 mils), a reflective layer (e.g., from 0.1 to 3 mils) and a pressure sensitive adhesive layer (e.g., of from 0.03 to 1 mil). Preferred film forming binders for the support layer would be polyethylene terephthalate or cellulose acetate. Preferred reflective layers would be titanium dioxide or zinc oxide in a colorless binder such as polyvinyl butyral or cellulose acetate butyrate. Preferred adhesives would be pressure sensitive acrylic adhesives or pressure sensitive polyurethane adhesives.

I claim:
1. A process for making a gravure printing plate comprising:
   (1) providing a halftone transparency,
   (2) putting a reflective layer in adhered optical contact with one side of said transparency,
   (3) placing said transparency with the reflective layer on a scanning drum of an electro-mechanical gravure etcher,
   (4) scanning the transparency with radiation,
   (5) generating electronic signals from radiation which is reflected from the transparency during scanning, and
   (6) using the electronic signals to direct a mechanical etcher to etch the gravure plates.
2. The process of claim 1 wherein the layer of reflective material is provided by adhering a film of reflective material to the backside of the transparency.
3. The process of claim 2 wherein said layer of reflective material is adhered to the transparency with a pressure-sensitive adhesive.
4. The process of claim 2 wherein the reflective layer is adhered to the transparency with a thermal adhesive.
5. The process of claim 1 wherein said reflective layer is opaque and comprises a white pigment in a polymeric binder.
6. The process of claim 5 wherein said pigment is titanium dioxide.
7. The process of claim 2 wherein said reflective layer comprises titanium dioxide in a polymeric binder.
8. The process of claim 3 wherein said reflective layer comprises titanium dioxide in a polymeric binder.
9. The process of claim 4 wherein said reflective layer comprises titanium dioxide in a polymeric binder.

* * * * *